United States Patent
Kato et al.

(10) Patent No.: US 7,095,366 B2
(45) Date of Patent: Aug. 22, 2006

(54) HIGH-FREQUENCY OSCILLATION APPARATUS, RADIO APPARATUS, AND RADAR

(75) Inventors: Takatoshi Kato, Mino (JP); Toru Ishii, Hirakata (JP); Fuminori Nakamura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 212 days.

(21) Appl. No.: 10/757,591

(22) Filed: Jan. 15, 2004

(65) Prior Publication Data

US 2004/0178946 A1     Sep. 16, 2004

(30) Foreign Application Priority Data

Mar. 14, 2003   (JP)   ............................. 2003-069311

(51) Int. Cl.
   *G01S 7/28* (2006.01)
(52) U.S. Cl. .................. 342/175; 342/70; 342/100
(58) Field of Classification Search ................ 342/175, 342/70–73, 89–103
   See application file for complete search history.

(56) References Cited

U.S. PATENT DOCUMENTS

| | | | |
|---|---|---|---|
| 4,694,260 A | | 9/1987 | Argintaru et al. |
| 4,780,691 A | | 10/1988 | Fiedziuszko |
| 5,034,703 A | * | 7/1991 | Schumacher .................. 331/2 |
| 5,159,346 A | * | 10/1992 | Bosch et al. .................. 342/175 |
| 5,252,981 A | * | 10/1993 | Grein et al. .................. 342/200 |
| 6,208,214 B1 | * | 3/2001 | Geddes et al. .................. 331/96 |
| 6,535,072 B1 | * | 3/2003 | Yamashita et al. .......... 331/107 G |
| 6,600,381 B1 | * | 7/2003 | Tokumitsu et al. .......... 331/99 |
| 6,714,089 B1 | * | 3/2004 | Ammar et al. ........... 331/107 DP |
| 6,897,735 B1 | * | 5/2005 | Nagasaku et al. .......... 331/117 D |
| 7,002,512 B1 | * | 2/2006 | Isaji .......................... 342/159 |
| 7,019,684 B1 | * | 3/2006 | Spencer et al. ............... 342/62 |
| 2001/0026195 A1 | * | 10/2001 | Tokumitsu et al. .......... 331/177 V |
| 2004/0041668 A1 | * | 3/2004 | Mikami et al. .............. 333/204 |
| 2006/0049979 A1 | * | 3/2006 | Miosga et al. .............. 342/175 |

FOREIGN PATENT DOCUMENTS

| | | |
|---|---|---|
| EP | 0 091 201 A1 | 10/1983 |
| JP | 2002-223169 | 8/2002 |

(Continued)

OTHER PUBLICATIONS

"Analysis on resonator coupling and its application to CMOS quadrature VCO quadrature VCO at 8 GHZ", Donghyun Baek; et al, Radio Frequency Integrated Circuits (RFIC) Symposium, 2003 IEEE Jun. 8-10 2003 P(s): 85-88.*

(Continued)

*Primary Examiner*—John B. Sotomayor
(74) *Attorney, Agent, or Firm*—Dickstein, Shapiro, Morin & Oshinsky, LLP.

(57) ABSTRACT

A high-frequency oscillation apparatus wherein an oscillation signal output from a voltage controlled oscillator (VCO) is transferred through a transfer line to a resonator and the resonator is excited. The resonator is coupled with a second transfer line and an RF signal having a level corresponding to the frequency of the oscillation signal is transferred through the second transfer line. When the resonant frequency of the resonator is set to a frequency higher than the oscillation-frequency modulation range of the VCO, the oscillation frequency and the RF-signal level have one-to-one correspondence. A detector detects the RF signal and outputs to a control section. The control section compensates a control voltage signal applied to the VCO according to the detected-signal level, and outputs the control voltage signal to the VCO to compensate the oscillation signal of the VCO.

16 Claims, 8 Drawing Sheets

FOREIGN PATENT DOCUMENTS

| | | | | |
|---|---|---|---|---|
| JP | 2004138415 | A | * | 5/2004 |
| JP | 2004282292 | A | * | 10/2004 |

OTHER PUBLICATIONS

"20 GHz integrated CMOS frequency sources with a quadrature VCO using trnaformers", Sangsoo Ko; et al, Radio Frequency Integrated Circuits (RFIC) Symposium, 2004. Digest of Papers. IEEE Jun. 6-8, 2004 P(s): 269-272.*

"An extremely low noise, phase lockable, sapphire loaded cavity based microwave oscillator", Wong, C.; Miccioli, W.F.; Insana, D.M.; Drubin, C.A. Microwave Symposium Digest, 1999 IEEE MTT-S Int'l vol. 1, 1999 Ps:91-94.*

"Analysis on resonator coupling and its application to CMOS quadrature VCO at 8 GHz", Donghyun Baek; Taeksang Song; Sangsoo Ko; Euisik Yoon; Songcheol Hong (RFIC) Symposium, IEEE Jun. 8-10, 2003 Ps: 85-88.*

"A 98 GHz voltage controlled oscillator in SiGe bipolar technology", Perndl, W.; Knapp.; Knapp, H.; Aufinger, K.; Meister, T.F.; Simburger, W.; Scholtz, A.L. Bipolar/BiCMOS Circuits and Technology Meeting. Proceedings of the Sep. 2003 Ps: 67-69.*

Copy of European Search Report dated Mar. 3, 2004.

English abstract of JP 55162634.

English abstract of JP 2002223169.

* cited by examiner

HIGH-FREQUENCY OSCILLATION APPARATUS, RADIO APPARATUS, AND RADAR

BACKGROUND OF THE INVENTION

1. Field of the Invention

The present invention relates to high-frequency oscillation apparatuses, radio apparatuses, and radars which include an oscillator for generating an oscillation signal in ultra high frequency bands such as the microwave band and the millimeter wave band.

2. Description of the Related Art

In general, frequency modulated, continuous wave radars (FM-CW radars) FM-modulate an oscillation frequency in a predetermined frequency range, continuously output a signal having a specific frequency, and receive a wave reflected from an object to observe the object. In the FM-CW radars, the oscillation frequency is modulated with the use of triangular waves having a frequency of about 100 MHz or higher, which are superior in linearity.

To generate triangular waves, which are superior in linearity, the following methods can be examined in general.

(1) Using a voltage-controlled oscillator VCO (hereinafter just called a "VCO") having a constant frequency-modulation sensitivity.

(2) Deforming a modulation signal in advance in the direction reverse to that of a modulation sensitivity characteristic so as to have a constant frequency-modulation sensitivity to obtain linearity.

(3) Forming a closed-loop circuit which monitors the oscillation frequency continuously, and applies compensation if the frequency is shifted.

In the method shown in (1), it is necessary to use a VCO having a superior modulation characteristic. Currently, it is very difficult to make such a VCO. If it is made, it is very expensive.

In the method shown in (2), successful linearity can be obtained relatively easy by using a low-frequency circuit. Since an open-loop circuit is compensated, the characteristic of the circuit may be shifted due to a change in the characteristic of the VCO, so that linearity is not obtained.

As a representative way to implement the method shown in (3), a phase-locked loop (PLL) system has been used. With this system, triangular waves, superior in linearity, are obtained, and even if the characteristic of the VCO is changed in time, it can be compensated. The PLL system requires, however, a reference oscillator, such as a crystal oscillator, and a scaler. Its structure is complicated and it is very expensive.

As a high-frequency oscillation apparatus in which the structure of the PLL is simplified and the oscillation center frequency is made stable, there is an apparatus (such as that disclosed in Japanese Unexamined Patent Application Publication No. 2002-223169) which includes a resonator coupled with a line transferring an oscillation signal sent from a VCO, a detector coupled with the resonator, for detecting the resonant-energy level output from the resonator, and a CPU for generating and outputting a VCO control voltage signal according to the output of the detector, and in which the resonant frequency of the resonator is set so as to match the oscillation center frequency of the oscillator.

A high-frequency oscillation apparatus disclosed in Japanese Unexamined Patent Application Publication No. 2002-223169 uses an FM-CW frequency modulation signal to measure changes of a resonant-energy level (passing-through-signal level) in time and detects the maximum value, that is, the resonant frequency of a resonator. Then, the apparatus detects the shift of the center frequency by the timing when the maximum value of the resonant-energy level appears to obtain the stable oscillation center frequency.

In such a high-frequency oscillation apparatus, it is easy to detect the shift of the center frequency and compensate for the shift. When each modulation waveform is compensated, however, since the oscillation center frequency matches the resonant frequency, that is, the resonant-energy level has the maximum value (peak) at the oscillation center frequency, the frequency of a modulated signal in which the oscillation center frequency is modulated by a desired frequency does not uniquely correspond to the output of the detector for detecting the resonant-energy level. Therefore, signal processing after demodulation, until the setting of a control voltage signal becomes complicated. Since the oscillation center frequency is set to the frequency where the resonant energy has a peak, changes in the resonant-energy level, corresponding to changes in frequency are very small around the peak, compared with other portions away from the peak. Therefore, it is difficult to correctly obtain the oscillation frequency from the resonant-energy level near the resonant frequency.

SUMMARY OF THE INVENTION

An object of the present invention is to provide a high-frequency oscillation apparatus and an oscillation-frequency compensation method which are capable of easily compensating for an oscillation frequency even if modulation is performed in any frequency-modulation range, and which have a stable oscillation frequency without having a complicated circuit structure as a whole.

The foregoing object is achieved in one aspect of the present invention through the provision of a high-frequency oscillation apparatus including an oscillator for oscillating at a specific frequency determined by a control voltage signal in a predetermined frequency modulation range, a resonator coupled with a line transferring the oscillation signal of the oscillator, for resonating at a frequency out of the predetermined frequency modulation range, a level detector coupled with the resonator, for detecting the resonant-energy level of the resonator, and a control section for generating the control voltage signal according to the resonant-energy level detected by the level detector.

With this structure, the resonator having the resonation frequency outside the predetermined frequency modulation range is coupled with the line which transfers the oscillation signal of the oscillator which oscillates at the specific frequency determined by the control voltage signal in the predetermined frequency modulation range to obtain the resonant-energy level of the resonator as the value uniquely determined for the oscillation frequency of the oscillator. Since the relationship between the resonant-energy level and the oscillation frequency can be determined in advance, the control section generates the control voltage signal used for compensating the oscillation frequency, according to the resonant-energy level, and outputs the signal to the VCO. Because the signal level corresponding uniquely (by one-to-one correspondence) to the oscillation frequency of the oscillator is detected in this way, even if the actual oscillation frequency is shifted from a desired oscillation frequency in modulation characteristics such as a frequency-modulation amount and linearity, the oscillation frequency can be easily compensated.

According to the present invention, when a resonator having a resonant frequency which is out of the frequency modulation range of a voltage-controlled oscillator VCO is coupled with a transfer line connected to the output of the VCO, the resonant-energy level of the resonator that uniquely corresponds (one-to-one correspondence) to the oscillation frequency of the VCO can be detected. Since the relationship between the oscillation frequency and the detected-signal level based on the resonant-energy level can be set, when the control section generates a control voltage signal used for compensating the oscillation frequency according to the resonant-energy level and inputs the signal into the VCO, the shift between the specified oscillation frequency and the actual oscillation frequency can be easily compensated for to output the oscillation signal having the stable oscillation frequency. In the same way, the shift between the specified frequency-modulation amount and the actual frequency-modulation amount can be detected, and the shift can be easily compensated for.

Since the resonant frequency of a resonator is specified out of the frequency modulation range of an oscillator, a change in the resonant-energy level, corresponding to a change in frequency becomes larger than in a case in which the resonant frequency of the resonator is specified within the frequency modulation range. Therefore, a frequency shift can be easily and highly precisely detected. With this, the oscillation frequency can be compensated highly precisely.

Further, since a closed-loop circuit can be structured only by a VCO, a transfer line, a resonator, a detector, and a simply-structured control section, a simple and compact high-frequency oscillation apparatus having a stable output characteristic is obtained.

The foregoing object is achieved in another aspect of the present invention through the provision of a high-frequency oscillation apparatus including an oscillator for oscillating at a specific frequency determined by a control voltage signal in a predetermined frequency modulation range, a first resonator coupled with a line transferring the oscillation signal of the oscillator, for resonating at a frequency higher than the center of the predetermined frequency modulation range, a second resonator coupled with the line transferring the oscillation signal of the oscillator, for resonating at a frequency lower than the center of the predetermined frequency modulation range, a first level detector coupled with the first resonator, for detecting the resonant-energy level of the first resonator, a second level detector coupled with the second resonator, for detecting the resonant-energy level of the second resonator, and a control section for generating the control voltage signal according to the difference between the resonant-energy levels detected by the first and second level detectors.

With this structure, the control voltage signal used for compensating the oscillation frequency is generated according to the difference between the resonant-energy levels of the first and second resonators, and output to the VCO. The difference corresponds uniquely (by one-to-one correspondence) to the oscillation frequency of the oscillator and is unlikely to be affected by the fluctuation of the oscillation output. Accordingly, the oscillation frequency can be accurately compensated.

The foregoing object is achieved in still another aspect of the present invention through the provision of a radio apparatus including one of the high-frequency oscillation apparatuses described above, and a transmitter for transmitting the oscillation signal.

With this, transmission is allowed at a predetermined highly precise frequency.

The foregoing object is achieved in yet another aspect of the present invention through the provision of a radar including a transmitter, the transmitter including one of the high-frequency oscillation apparatuses described above, and a receiver for receiving a signal emitted by the transmitter and reflected from an object.

A radar according to the present invention includes one of the above-described high-frequency oscillation apparatuses. Therefore, a stable oscillation frequency is obtained and the shift of the oscillation frequency can be easily compensated for. With this, an object can be stably and correctly detected by a CW radar system or an FM-CW radar system.

DESCRIPTION OF THE PREFERRED EMBODIMENTS

A high-frequency oscillation apparatus according to a first embodiment of the present invention will be described below by referring to FIG. 1 to FIG. 4.

Figure 1:
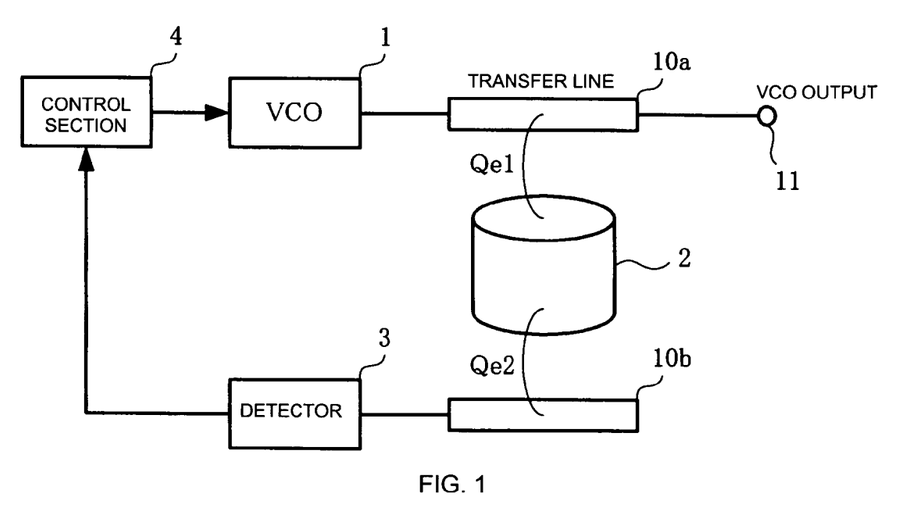
FIG. 1 is a block diagram showing a main part of a high-frequency oscillation apparatus according to a first embodiment of the present invention.

FIG. 1 is a block diagram showing a main part of the high-frequency oscillation apparatus according to the present embodiment. There is shown a voltage-controlled oscillator (hereinafter called just a "VCO") 1, a resonator 2, a detector 3 providing level detection, and a control section 4. The resonator 2 is preferably made from a column-shaped dielectric which resonates at the TE01δ mode. The detector 3 is preferably formed of Schottky barrier diodes (SBDs).

Figure 2:
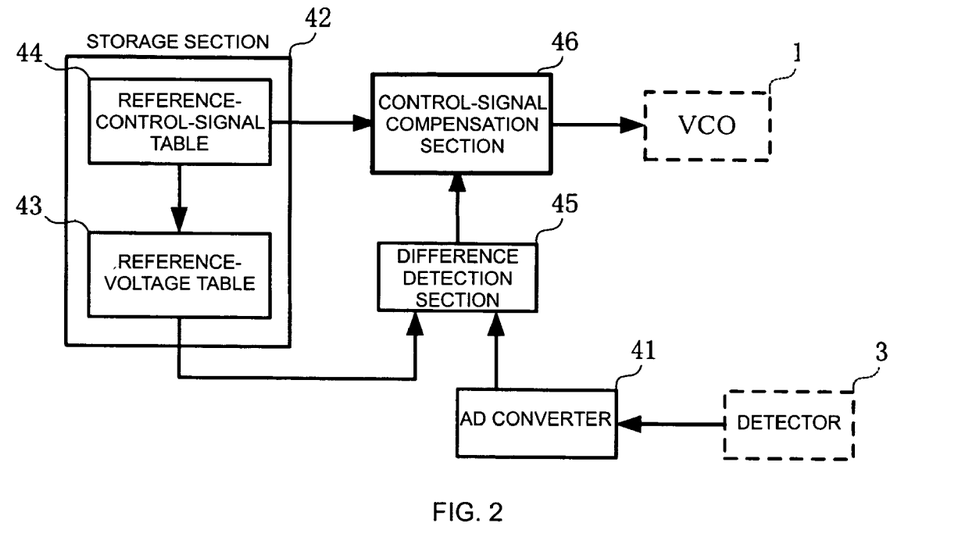
FIG. 2 is a block diagram showing a main part of a control section in the high-frequency oscillation apparatus according to the first embodiment of the present invention.

FIG. 2 is a block diagram showing a main part of the control section 4.

As shown in FIG. 1, an oscillation signal sent from the VCO 1 is transferred through a transfer line 10a, and output from a VCO output 11. When the oscillation signal of the VCO 1 is transferred through the transfer line 10a, the transfer line 10a is coupled with the resonator 2 with a coupling amount of Qe1, this coupling excites the resonator 2, and the resonator 2 is coupled with a transfer line 10b with a coupling amount of Qe2. The transfer line 10b is connected to the detector 3, the output of the detector 3 is input to the control section 4, and the output of the control section 4 is input to the VCO 1. In this way, the VCO 1, the transfer line 10a, the resonator 2, the transfer line 10b, the detector 3, and the control section 4 form a closed-loop circuit.

The above-described transfer line 10a is preferably formed of a dielectric line structured by a dielectric strip and upper and lower electrically conductive planes which sandwich the dielectric strip. The transfer line 10b is preferably formed of the upper and lower electrically conductive planes, and a microstripline or a suspended line structured by a line pattern on a substrate disposed between the upper and lower electrically conductive planes. The resonator 2 is disposed between the electrically conductive planes so as to couple with the dielectric strip and the line pattern on the substrate.

As shown in FIG. 2, the control section 4 is formed of an AD converter 41, a storage section 42 provided with a reference-voltage table 43 and a reference-control-signal table 44, a difference detection section 45, and a control-signal compensation section 46. The reference-voltage table 43 stores the relationship between a detected-signal level and an oscillation frequency. The reference-control-signal table 44 stores the relationship among output timing, an intended oscillation frequency (hereinafter called a "target frequency"), a control-voltage-signal level (hereinafter called a "target-control-voltage-signal level") required to obtain the target frequency.

Figure 3:
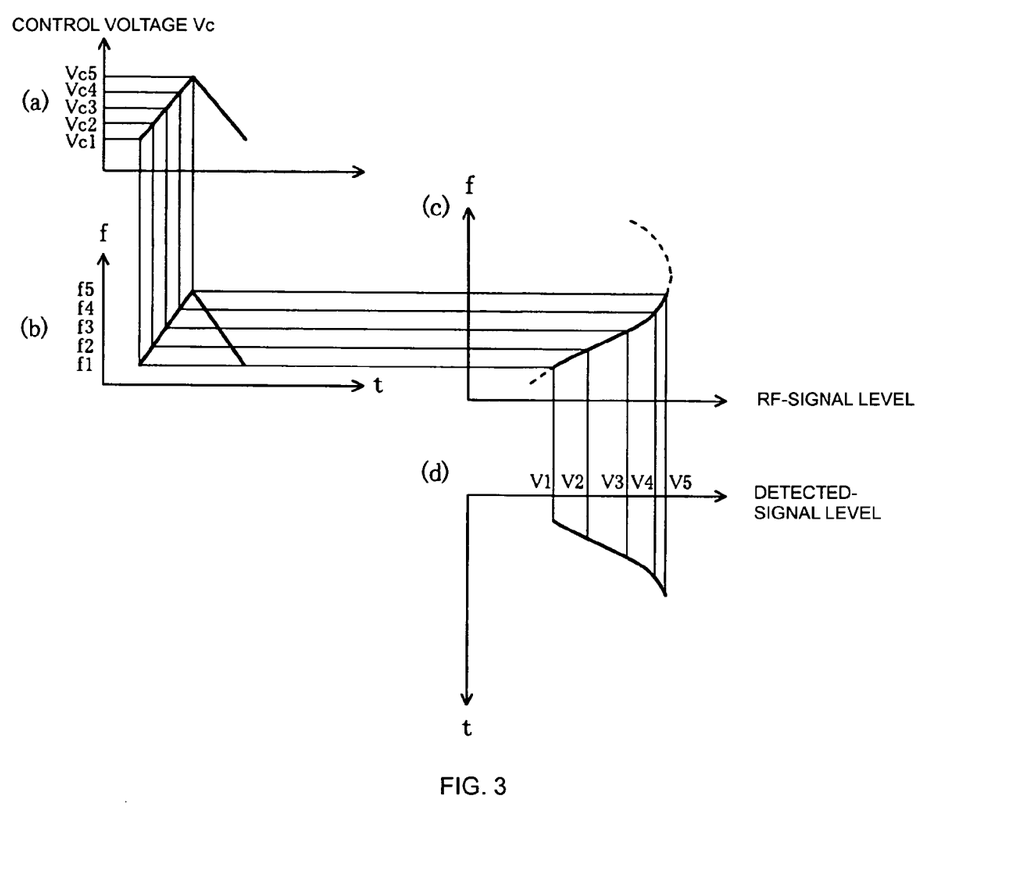
FIG. 3 is a view showing a control voltage applied to a VCO 1, the oscillation frequency thereof, the resonant characteristic of a resonator 2, and the detected-signal output of a detector 3.

In such a high-frequency oscillation apparatus, when the oscillation signal output from the VCO 1 is transferred through the transfer line 10a, the transfer line 10a is coupled with the resonator 2 and the resonator 2 is excited. When the resonator 2 is coupled with the transfer line 10b, a predetermined RF signal is output to the transfer line 10b. The level (magnitude) of the RF signal depends on the resonator characteristic of the resonator 2 as shown in FIG. 3(c), and is determined according to the frequency of the oscillation signal. This passing-through signal is detected by the detector 3, and output to the control section 4. The control section 4 generates a control voltage signal for the VCO 1 according to the detected signal by a method described later, and outputs the control voltage signal to the VCO 1 to compensate the oscillation signal of the VCO 1.

A method for compensating the frequency of the oscillation signal will be described next in detail by referring to FIG. 3.

FIG. 3 shows the control voltage sent to the VCO 1, the oscillation frequency, the resonant characteristic of the resonator 2, and the detected-signal output from the detector 3. When the control voltage sent to the VCO 1 is changed in a rectangular-wave manner within a predetermined frequency range as shown in FIG. 3(a) as the time passes, the oscillation frequency of the VCO 1 is changed accordingly as shown in FIG. 3(b). In other words, the oscillation frequency increases as the control voltage is raised in a manner in which a control voltage of Vc1 sent to the VCO 1 corresponds to an oscillation frequency of f1 in the VCO 1, and a control voltage of Vc2 sent to the VCO 1 corresponds to an oscillation frequency of f2 in the VCO 1.

Since the RF-signal level of the resonator 2 is changed according to the resonator characteristic as shown in FIG. 3(c) as the oscillation frequency of the VCO 1 is changed, the level of the detected signal output from the detector 3 is also changed as shown in FIG. 3(d). An oscillation frequency of f1 corresponds to a detected-signal level of V1, and an oscillation frequency of f2 corresponds to a detected-signal level of V2. The oscillation-frequency modulation range is from f1 to f5.

When the resonant frequency of the resonator is set to a frequency higher than the oscillation-frequency modulation range of the VCO 1, as shown in FIG. 3(c), the detected-signal level increases monotonously as the oscillation frequency is raised. In other words, the detected-signal level V2 obtained at an oscillation frequency of f2 (>f1) is higher than the detected-signal level V1 obtained at an oscillation frequency of F1, and the detected-signal level increases from V1 to V2, to V3, to V4, and to V5 as the oscillation frequency is raised from f1 to f2, to f3, to f4, and to f5. One detected-signal level is not obtained at different oscillation frequencies. When the oscillation frequencies have a relationship of f1<f2<f3<f4<f5, the detected-signal levels have a relationship of V1<V2<V3<V4<V5.

When the resonant frequency of the resonator is set to a frequency higher than the oscillation-frequency modulation range of the VCO 1, a unique detected-signal level is obtained for each oscillation frequency.

When the user specifies a desired oscillation frequency in such a high-frequency oscillation apparatus, the control-voltage-signal level (hereinafter called a "specified-control-voltage-signal level") corresponding to the specified oscillation frequency is read from the reference-control-signal table 44 of the storage section 42 in the control section 4, and is output to the VCO 1 through the control-signal compensation section 46. The VCO 1 oscillates at a predetermined oscillation frequency according to the input specified-control-voltage-signal level, and outputs the oscillation signal to the transfer line 10a. This oscillation signal couples the resonator 2 with the transfer line 10b, and as described above, an RF signal having the level corresponding to the oscillation frequency of the oscillation signal is input to the detector 3, and the detector 3 detects the RF signal, generates a detected signal having the level corresponding to the RF-signal level, and outputs it to the control section 4.

The AD converter 41 in the control section 4 amplifies the input detected signal and AD-converts it to obtain the detected-signal level (hereinafter called an "actually-detected-signal level") corresponding to the oscillation frequency of the oscillation signal currently oscillating, as digital data. The control section 4 reads the currently specified oscillation frequency (control-voltage-signal level) from the reference-control-signal table 44, and obtains the detected-signal level (hereinafter called a "specified-detected-signal level") corresponding to the specified oscillation frequency by referring to the reference-voltage table 43. The difference detection section 45 receives the actually-detected-signal level and the specified-detected-signal level, and performs predetermined calculation processing which includes a difference calculation to generate a compensation signal and output it to the control-signal compensation section 46. The compensation signal indicates the amount of compensation to be applied to the control voltage signal, based on the difference between the actually-detected-signal level and the specified-detected-signal level. The control-signal compensation section 46 compensates the specified-control-voltage-signal level sent from the reference-control-signal table 44, according to the compensation signal, and outputs the level to the VCO 1. The VCO 1 oscillates at the oscillation frequency based on the newly-compensated specified-control-voltage-signal level and outputs the oscillation signal. The series of closed-loop signal processing is repeated to stabilize and output the oscillation signal having the desired oscillation frequency.

Since the resonant frequency of the resonator is set to a frequency higher than the oscillation-frequency range, a unique detected-signal voltage is measured for each oscillation frequency. Therefore, there is no need to analyze the relationship between the input detected-signal voltage and the oscillation frequency, which is required before. The control voltage signal can be easily compensated with a relatively simple circuit structure.

When the RF-signal level is specified corresponding to an oscillation frequency by using not a portion close to the resonant frequency (peak), having a small change but a portion having a large change in the resonator characteristic, a change in the RF-signal level caused by a change in the oscillation frequency is made large. With this, the fluctuation of the oscillation frequency can be easily detected, and the VCO is made to oscillate at a desired oscillation frequency in a more stable manner.

In the above description, the method for stabilizing the oscillation frequency is explained. Also when the oscillation frequency is modulated from a predetermined oscillation center frequency, if the control section calculates and stores the detected-signal level corresponding to the amount of frequency modulation, the difference between the specified amount of frequency modulation and the actual amount of frequency modulation can be detected to compensate the oscillation frequency. Further, when a modulation characteristic in which linearity is required is obtained, since the difference between the specified oscillation frequency and the actual oscillation frequency is correctly detected, and the oscillation frequency of the VCO is easily compensated, the specified modulation characteristic can be implemented in a stable manner.

Figure 4:
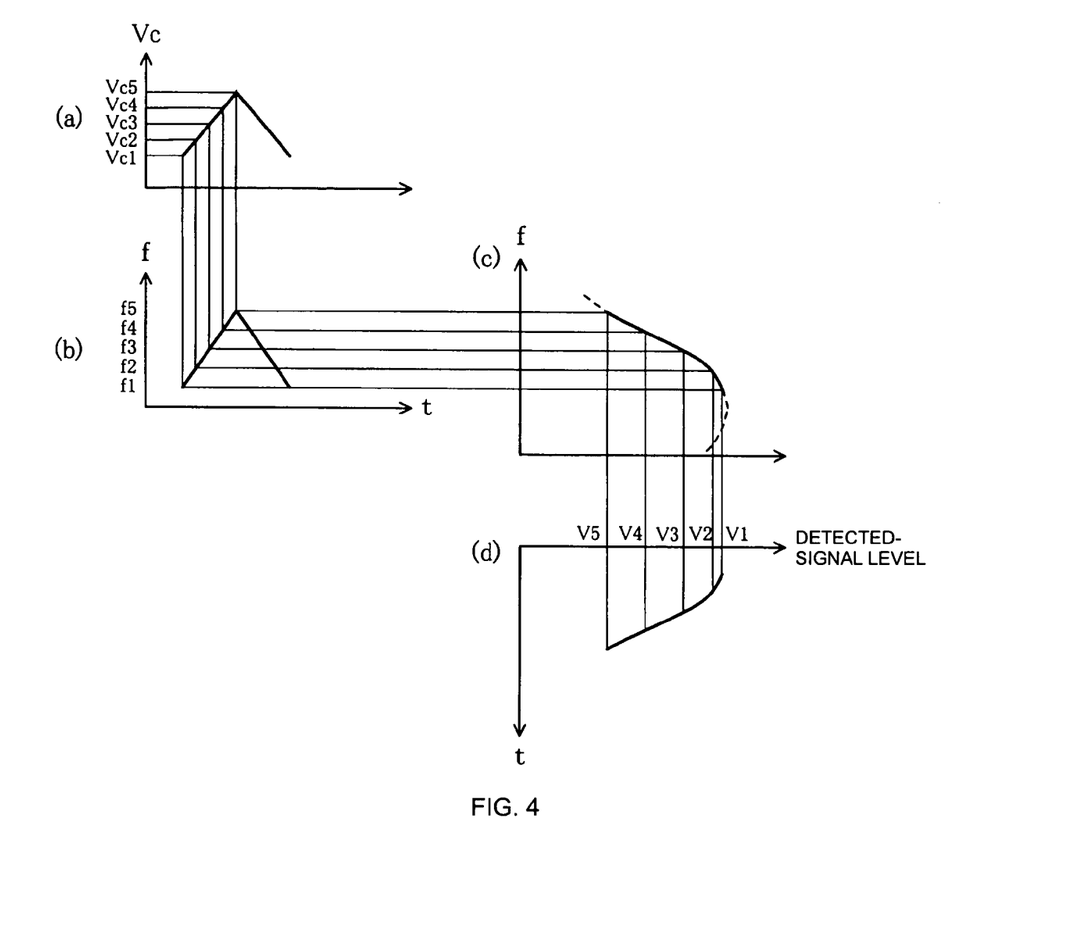
FIG. 4 is a view showing a control voltage applied to the VCO 1, the oscillation frequency thereof, the resonant characteristic of the resonator 2, and the detected-signal output of the detector 3.

In the present embodiment, the resonant frequency of the resonator is set to a frequency higher than the oscillation-frequency modulation range of the VCO 1. The resonant frequency of the resonator, however, may be set to a frequency lower than the oscillation-frequency modulation range of the VCO 1, as shown in FIG. 4.

In this case, the detected-signal level decreases monotonously as the oscillation frequency is raised. In other words, the detected-signal level V2 obtained at an oscillation frequency of f2 (>f1) is lower than the detected-signal level V1 obtained at an oscillation frequency of F1, and the detected-signal level decreases from V1 to V2, to V3, to V4, and to V5 as the oscillation frequency is raised from f1 to f2, to f3, to f4, and to f5. One detected-signal level is not obtained at different oscillation frequencies. When the oscillation frequencies have a relationship of f1<f2<f3<f4<f5, the detected-signal levels have a relationship of V1>V2>V3>V4>V5.

Even with such a structure, since a unique detected-signal level is determined for each oscillation frequency, the same advantages as those described above are obtained.

A high-frequency oscillation apparatus according to a second embodiment of the present invention will be described below by referring to FIG. 5 to FIG. 7.

Figure 5:
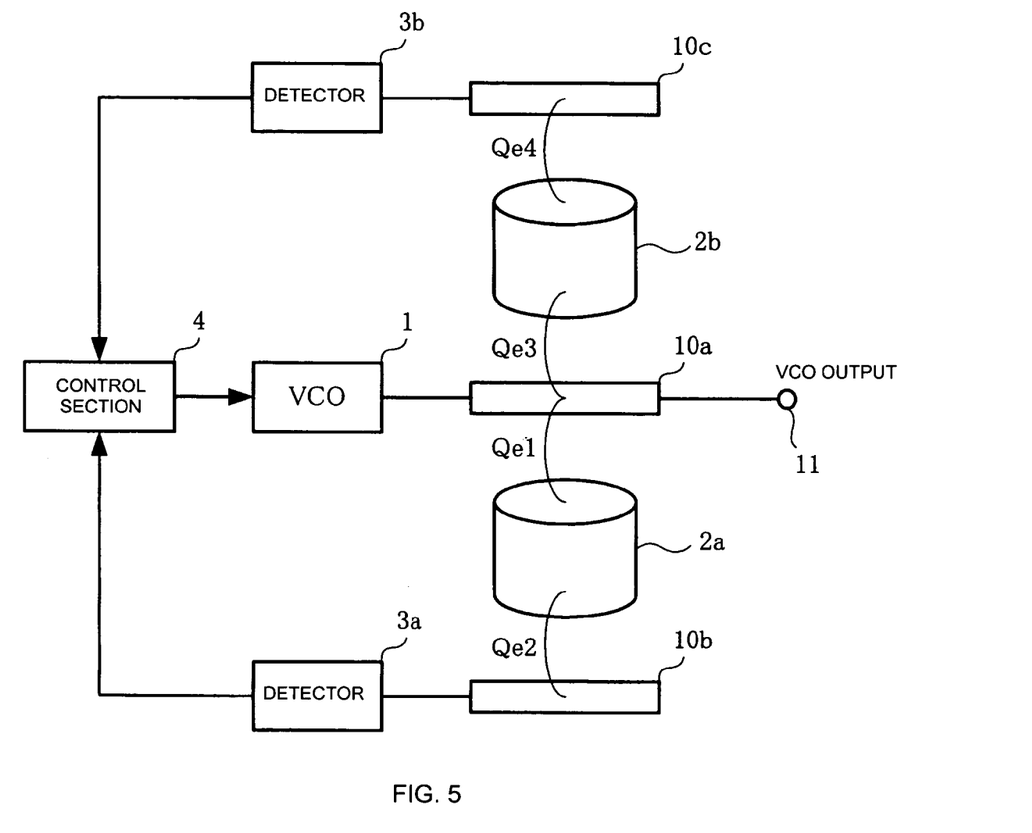
FIG. 5 is a block diagram showing a main part of a high-frequency oscillation apparatus according to a second embodiment of the present invention.

FIG. 5 is a block diagram showing a main part of the high-frequency oscillation apparatus according to the present embodiment. There is shown a VCO, resonators 2a and 2b having different resonant frequencies, detectors 3a and 3b coupled with the resonators 2a and 2b, respectively, and a control section 4. Each of the resonators 2a and 2b is made from a column-shaped dielectric which resonates at the TE01δ mode. The resonant frequency of the resonator 2a is preferably set to a frequency higher than the oscillation-frequency modulation range of the VCO 1, and the resonant frequency of the resonator 2b is preferably set to a frequency lower than the oscillation-frequency modulation range of the VCO 1. The detectors 3a and 3b are preferably formed of Schottky barrier diodes (SBDs).

Figure 6:
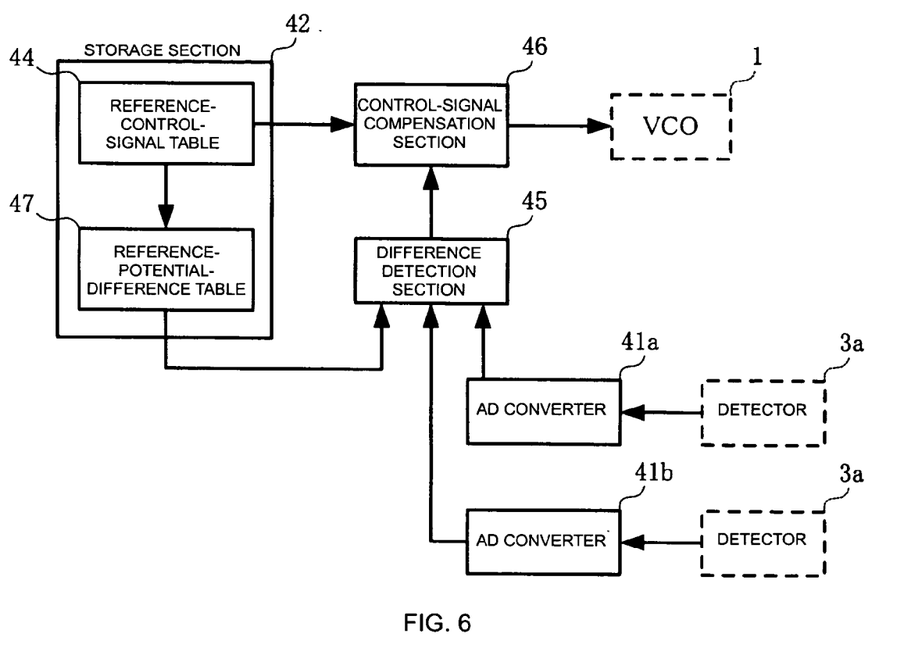
FIG. 6 is a block diagram showing a main part of a control section in the high-frequency oscillation apparatus according to the second embodiment of the present invention.

FIG. 6 is a block diagram showing the structure of the control section 4.

As shown in FIG. 5, an oscillation signal sent from the VCO 1 is transferred through a transfer line 10a, and output from a VCO output 11. When the oscillation signal of the VCO 1 is transferred through the transfer line 10a, the transfer line 10a is coupled with the resonators 2a and 2b with coupling amounts of Qe1 and Qe3, respectively. The coupling excites the resonators 2a and 2b, and the resonators 2a and 2b are coupled with transfer lines 10b and 10c with coupling amounts of Qe2 and Qe4, respectively. The transfer line 10b is connected to the detector 3a, and the transfer line 10c is connected to the detector 3b. The outputs of the detectors 3a and 3b are input to the control section 4, and the output of the control section 4 is input to the VCO 1. In this way, the VCO 1, the transfer line 10a, the resonators 2a and 2b, the transfer lines 10b and 10c, the detectors 3a and 3b, and the control section 4 form closed-loop circuits.

As shown in FIG. 6, the control section 4 is formed of AD converters 41a and 41b, a storage section 42 provided with a reference-potential-difference table 47 and a reference-control-signal table 44, a difference detection section 45, and a control-signal compensation section 46. The reference-potential-difference table 47 stores the relationship between an oscillation frequency and the difference between the levels of the detected signals sent from the two detectors 3a and 3b.

In such a high-frequency oscillation apparatus, when the oscillation signal output from the VCO 1 is transferred through the transfer line 10a, the transfer line 10a is coupled with the resonators 2a and 2b and the resonators 2a and 2b are excited. When the resonators 2a and 2b are excited, the resonator 2a is coupled with the transfer line 10b, and the resonator 2b is coupled with the transfer line 10c, RF signals having the levels corresponding to the frequency of the oscillation signal are transferred through the transfer lines 10b and 10c. These RF signals are detected by the detectors 3a and 3b, and output to the control section 4. The control section 4 generates a control voltage signal for the VCO 1 according to the difference between the detected signals by a method described later, and outputs the control voltage signal to the VCO 1 to compensate the oscillation signal of the VCO 1.

A method for compensating the frequency of the oscillation signal will be described next in detail by referring to FIG. 7.

Figure 7:
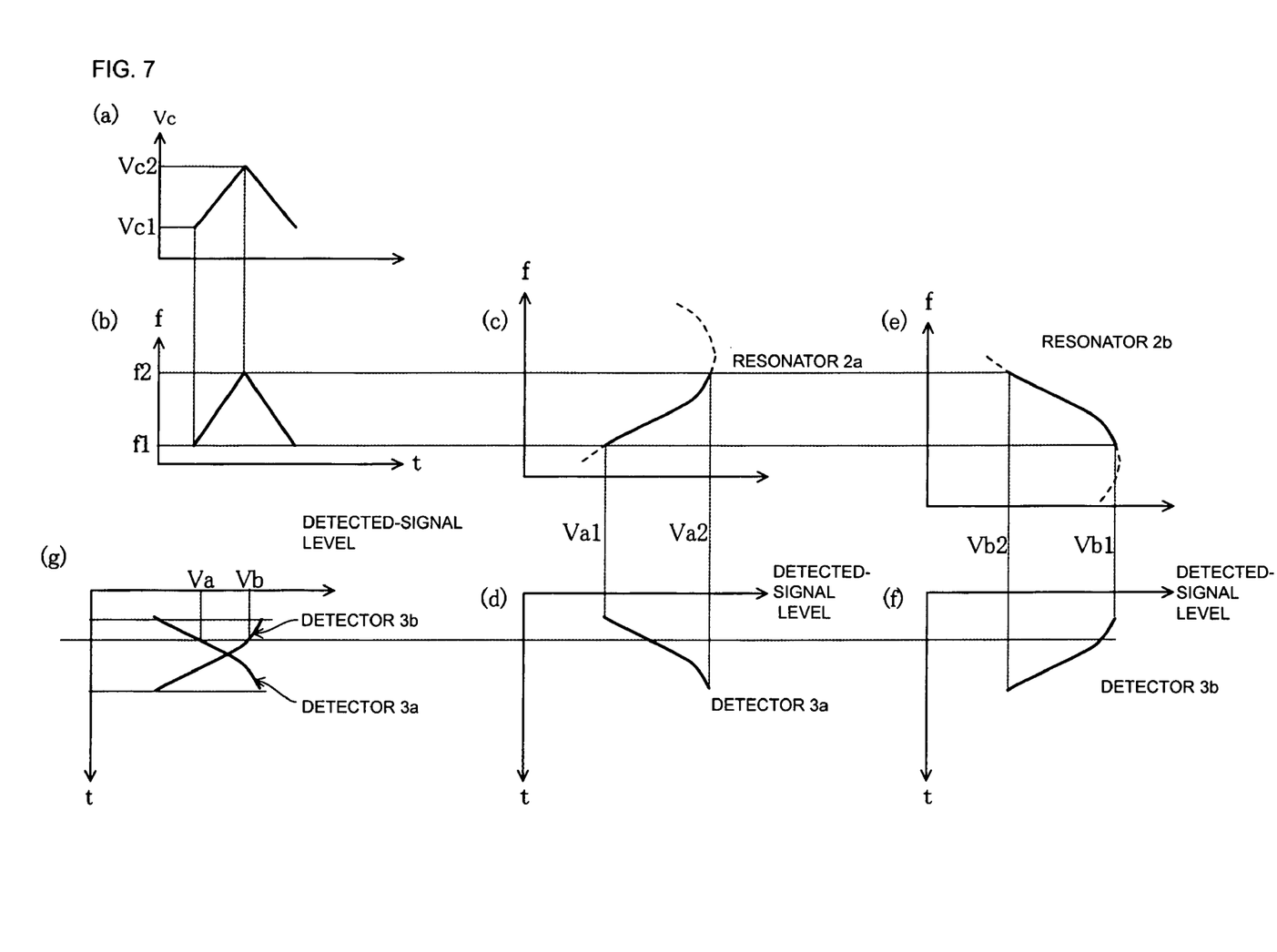
FIG. 7 is a view showing a control voltage applied to a VCO 1, the oscillation frequency thereof, the resonant characteristic of a resonator 2, and the detected-signal output of a detector 3.

FIG. 7 shows the control voltage sent to the VCO 1, the oscillation frequency, the resonant characteristics of the resonators 2a and 2b, the detected signals output from the detectors 3a and 3b, and the difference between the detected-signal outputs. When the control voltage sent to the VCO 1 is changed in a rectangular-wave manner within a predetermined frequency range as shown in FIG. 7(a) as the time passes, the oscillation frequency of the VCO 1 is changed accordingly as shown in FIG. 7(b). In other words, the oscillation frequency increases as the control voltage is raised in a manner in which a control voltage of Vc1 sent to the VCO 1 corresponds to an oscillation frequency of f1 in the VCO 1, and a control voltage of Vc2 sent to the VCO 1 corresponds to an oscillation frequency of f2 in the VCO 1.

Since the RF-signal level of the resonator 2a is changed according to the resonator characteristic as shown in FIG. 7(c) as the oscillation frequency of the VCO 1 is changed, the level of the detected signal output from the detector 3a is also changed as shown in FIG. 7(d). An oscillation frequency of f1 corresponds to a detected-signal level of Va1, and an oscillation frequency of f2 corresponds to a detected-signal level of Va2.

When the resonant frequency of the resonator 2a is set to a frequency higher than the oscillation-frequency modulation range of the VCO 1, as shown in FIG. 7(c), the detected-signal level increases monotonously as the oscillation frequency is raised. In other words, the detected-signal level Va2 obtained at an oscillation frequency of f2 (>f1) is higher than the detected-signal level Va1 obtained at an oscillation frequency of F1, and the detected-signal level increases from Va1 to Va2 as the oscillation frequency is raised from f1 to f2. One detected-signal level is not obtained at different oscillation frequencies. When the oscillation frequencies have a relationship of f1<f2, the detected-signal levels have a relationship of Va1<Va2.

Since the RF-signal level of the resonator 2b is changed according to the resonator characteristic as shown in FIG. 7(e) as the oscillation frequency of the VCO 1 is changed, the level of the detected signal output from the detector 3b is also changed as shown in FIG. 7(f). An oscillation frequency of f1 corresponds to a detected-signal level of Vb1, and an oscillation frequency of f2 corresponds to a detected-signal level of Vb2.

When the resonant frequency of the resonator 2b is set to a frequency lower than the oscillation-frequency modulation range of the VCO 1, as shown in FIG. 7(e), the detected-signal level decreases monotonously as the oscillation frequency is raised. In other words, the detected-signal level Vb2 obtained at an oscillation frequency of f2 (>f1) is lower than the detected-signal level Vb1 obtained at an oscillation frequency of F1, and the detected-signal level decreases from Vb1 to Vb2 as the oscillation frequency is raised from f1 to f2. One detected-signal level is not obtained at different oscillation frequencies. When the oscillation frequencies have a relationship of f1 <f2, the detected-signal levels have a relationship of Vb1>Vb2.

When the resonant frequency of the resonator 2a is set to a frequency higher than the oscillation-frequency modulation range of the VCO 1, and the resonant frequency of the resonator 2b is set to a frequency lower than the oscillation-frequency modulation range of the VCO 1 in this way, the difference (Vb−Va), the potential difference, of the detected-signal levels measured by the detectors 3a and 3b is calculated for each oscillation frequency, as shown in FIG. 7(g).

In the present embodiment, the resonant frequencies of the resonators 2a and 2b are set outside the oscillation-frequency modulation range. The resonant frequencies may be set to a high frequency and a lower frequency within the oscillation-frequency modulation range. This is allowed because the RF-signal level of the resonator 2b can uniquely determine whether it is at the higher-frequency side or the lower-frequency side of the resonant peak of the resonator 2a.

When an oscillation signal is output in such a high-frequency oscillation apparatus as described in the first embodiment, the oscillation signal couples the resonator 2a with the transfer line 10b and couples the resonator 2b with the transfer line 10c. The RF signals having the level corresponding to the oscillation frequency of the oscillation signal are then input to the detectors 3a and 3b, and the detectors 3a and 3b detect the RF signals, generate detected signals having the levels corresponding to the RF-signal levels, and output them to the control section 4.

The AD converters 41a and 41b in the control section 4 amplify the detected signals input from the detectors 3a and 3b and AD-convert them to obtain the actually-detected-signal levels, as digital data. The control section 4 reads the control voltage signal corresponding to the currently specified oscillation frequency from the reference-control-signal table 44, and obtains the difference (hereinafter called a "specified difference") between detected-signal levels corresponding to the specified oscillation frequency by referring to the reference-potential-difference table 47. The difference detection section 45 performs a difference calculation according to the actually-detected-signal levels output from the AD converters 41a and 41b to obtain the difference (hereinafter called a "actual difference") between the actually-detected-signal levels, and further performs predetermined calculation processing which includes a difference calculation according to the actual difference and the specified difference to generate a compensation signal and output it to the control-signal compensation section 46. The compensation signal indicates the amount of compensation to be applied to the control voltage signal, based on the difference between the actual difference and the specified difference. The control-signal compensation section 46 compensates the specified-control-voltage level sent from the reference-control-signal table 44, according to the compensation signal, and outputs the level to the VCO 1. The VCO 1 oscillates at the oscillation frequency based on the newly-compensated specified-control-voltage level and outputs the oscillation signal. The series of closed-loop signal processing is repeated to output the oscillation signal having the desired oscillation frequency in a stable manner.

Since the difference (potential difference) of detected-signal levels is changed larger between different oscillation frequencies than the voltage detected from a single detected-signal level, the shift of the oscillation frequency can be measure more precisely, and the oscillation frequency can be compensated more stably and more precisely.

Even if the output of the VCO fluctuates, since the above-described two actually-detected-signal levels fluctuate accordingly, the difference therebetween is barely affected by the fluctuation of the VCO output. With this, the oscillation frequency can be compensated in a further stable manner without barely being affected by the VCO output.

In the above-described embodiments, the dielectric resonators are used. A resonator or a band-pass filter which passes a signal at a predetermined frequency range may be used.

In each of the above-described embodiments, the dielectric line is used as the transfer line connected to the VCO output, and the microstripline or suspended line is used as a detection transfer line. Any transfer lines, such as a dielectric line, a microstripline, a suspended line, a CPW line, and a slot line, can be used for both transfer lines.

Further, the closed-loop processing for compensating the oscillation signal may be performed in real time during an FMCW operation, or may be performed as a compensation operation with a separate compensation sequence being provided. When the compensation sequence is achieved at a low speed, a low-speed sensor, such as a thermistor, can be used for a detection device.

An FM-CW radar according to a third embodiment of the present invention will be described next by referring to FIG. 8.

Figure 8:
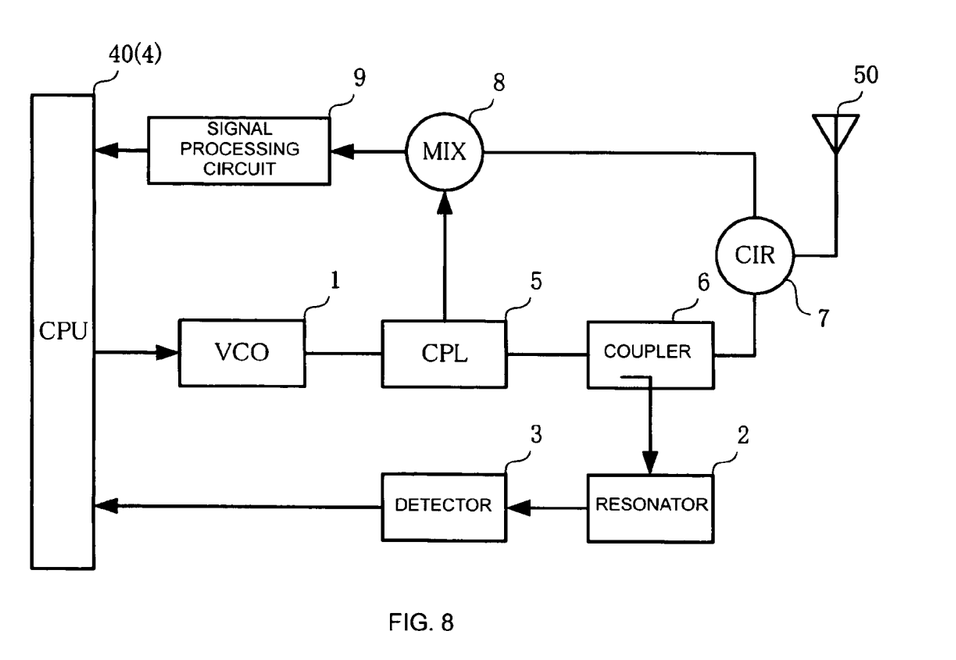
FIG. 8 is a block diagram showing a main part of an FM-CW radar according to a third embodiment of the present invention.

FIG. 8 is a block diagram showing a main part of the FM-CW radar according to the present embodiment. There are shown a voltage-controlled oscillator (VCO) 1, a coupler (CPL) 5, a circulator (CIR) 7, an a mixer (MIX) 8. The coupler (CPL) 5 sends the oscillation signal of the VCO 1 to the input port side of the circulator (CIR) 7, and takes out a part of the signal as a local signal to send it to the mixer (MIX) 8. The circulator (CIR) 7 sends a signal to be transmitted, to an antenna 50, and sends a received signal sent from the antenna 50, to the mixer (MIX) 8. A signal processing circuit 9 applies a predetermined process to the output signal of the mixer (MIX) 8, and outputs it to a CPU 40. The CPU 40 modulates the oscillation frequency of the oscillation signal of the VCO 1 in a triangular-wave manner, and calculates the distance to an object and its relative speed by a combination of the two bead signals (down beat and up beat) produced from the reflected signal from the object and the local signal.

A coupler 6 couples a line through which the signal to be transmitted passes, with a resonator 2. A detector 3 is coupled with the resonator 2 to detect the passing-through signal of the resonator 2. The CPU 40 receives the detected signal from the detector 3, and compensates a control voltage signal applied to the VCO 1, according to the level of the detected signal.

The structure of the above-described high-frequency oscillation apparatus is used for the VCO 1, the resonator 2, the detector 3, and the coupler 6 of the FM-CW radar, and the CPU 40 is structured by the above-described control section 4. With such a structure, the FM-CW radar can output the oscillation signal having a stable oscillation frequency and is superior in modulation characteristics. With this, an object can be detected accurately. In addition, since the closed-loop circuit which performs oscillation control can be structured by a simple circuit, the FM-CW radar has a simple structure and is compact.

In the present embodiment, the FM-CW radar is taken as an example. The above-described structure and advantages can be applied to radio apparatuses which require an oscillation signal having a stable oscillation frequency, such as CW radars, and ratio apparatus which require a stable, highly precise modulation characteristic.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A high-frequency oscillation apparatus comprising:
an oscillator for oscillating at a specific frequency determined by a control voltage signal in a predetermined frequency modulation range;
a resonator coupled with a line transferring the oscillation signal of the oscillator, for resonating at a frequency out of the predetermined frequency modulation range;
a level detector coupled with the resonator, for detecting the resonant-energy level of the resonator; and
a control section for generating the control voltage signal according to the resonant-energy level detected by the level detector.

2. The high-frequency oscillation apparatus according to claim 1, wherein the line is a dielectric line comprising a dielectric strip sandwiched by electrically conductive planes.

3. The high-frequency oscillation apparatus according to claim 1, wherein the control section comprises:
an AD converter;
a storage section provided with a reference-voltage table and a reference-control-signal table;
a difference detection section; and
a control-signal compensation section, wherein
the reference-voltage table stores the relationship between a detected-signal level and an oscillation frequency,
the reference-control-signal table stores the relationship among output timing, an intended oscillation frequency, and a control-voltage-signal level for obtaining the intended oscillation frequency.

4. The high-frequency oscillation apparatus according to claim 1, wherein a resonant frequency of the resonator is set to a frequency higher than the frequency modulation range of the oscillator.

5. The high-frequency oscillation apparatus according to claim 1, wherein a resonant frequency of the resonator is set to a frequency lower than the frequency modulation range of the oscillator.

6. A radar comprising:
a transmitter, the transmitter comprising a high-frequency oscillation apparatus according to claim 1; and
a receiver for receiving a signal emitted by the transmitter and reflected from an object.

7. A high-frequency oscillation apparatus comprising:
an oscillator for oscillating at a specific frequency determined by a control voltage signal in a predetermined frequency modulation range;
a first resonator coupled with a line transferring the oscillation signal of the oscillator, for resonating at a frequency higher than the center of the predetermined frequency modulation range;
a second resonator coupled with the line transferring the oscillation signal of the oscillator, for resonating at a frequency lower than the center of the predetermined frequency modulation range;
a first level detector coupled with the first resonator, for detecting the resonant-energy level of the first resonator;
a second level detector coupled with the second resonator, for detecting the resonant-energy level of the second resonator; and
a control section for generating the control voltage signal according to the difference between the resonant-energy levels detected by the first and second level detection means.

8. The high-frequency oscillation apparatus according to claim 7, wherein the line is a dielectric line comprising a dielectric strip sandwiched by electrically conductive planes.

9. The high-frequency oscillation apparatus according to claim 7, wherein the control section comprises:
a first AD converter coupled to the first level detector;
a second AD converter coupled to the second level detector;
a storage section provided with a reference-potential-difference table and a reference-control-signal table;
a difference detection section; and
a control-signal compensation section, wherein
the reference-potential difference table stores the relationship between an oscillation frequency and the difference between the resonant-energy level of the first resonator and the resonant-energy level of the second resonator,
the reference-control-signal table stores the relationship among output timing, an intended oscillation frequency, and a control-voltage-signal level for obtaining the intended oscillation frequency.

10. The high-frequency oscillation apparatus according to claim 7, wherein a resonant frequency of the first resonator is set to a frequency higher than the frequency modulation range of the oscillator, and wherein a resonant frequency of the second resonator is set to a frequency lower than the frequency modulation range of the oscillator.

11. A radar comprising:
a transmitter, the transmitter comprising a high-frequency oscillation apparatus according to claim 7; and
a receiver for receiving a signal emitted by the transmitter and reflected from an object.

12. A high-frequency oscillation method comprising:
outputting an oscillation signal;
transferring the oscillation signal to a resonator so as to excite the resonator;
outputting a predetermined signal from the resonator, the predetermined signal being determined according to a frequency of the oscillation signal;
generating a control voltage signal according to the predetermined signal; and
using the control voltage signal for compensation of the oscillation signal.

13. The high-frequency oscillation method according to claim 12, wherein compensation of the oscillation frequency comprises:
changing the control voltage signal in a rectangular-wave manner within a predetermined frequency range over time so as to change the frequency of the oscillation signal.

14. The high-frequency oscillation method according to claim 12, wherein the frequency of the oscillation signal is modulated from a predetermined center frequency if the difference between a specified amount of frequency modulation and an actual amount of frequency modulation is detected for compensation of the oscillation signal.

15. The high-frequency oscillation method according to claim 12, wherein a resonant frequency of the resonator is set to a frequency higher than a frequency modulation range of the oscillation signal.

16. The high-frequency oscillation method according to claim 12, wherein a resonant frequency of the resonator is set to a frequency lower that a frequency modulation range of the oscillation signal.

* * * * *